(12) United States Patent
Nishiyama

(10) Patent No.: US 6,324,067 B1
(45) Date of Patent: Nov. 27, 2001

(54) PRINTED WIRING BOARD AND ASSEMBLY OF THE SAME

(75) Inventor: Tousaku Nishiyama, Uda-gun (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/553,557

(22) Filed: Apr. 20, 2000

Related U.S. Application Data

(63) Continuation of application No. 08/745,560, filed on Nov. 8, 1996.

(30) Foreign Application Priority Data

Nov. 16, 1995 (JP) .................................................... 7-298328

(51) Int. Cl.[7] ................................ H05K 7/02; H05K 7/06
(52) U.S. Cl. ........................ 361/761; 361/760; 361/762; 361/764; 361/773; 361/783; 361/795; 257/700; 257/723; 257/737; 257/778; 174/262; 174/264; 428/209; 428/304.4; 428/321.3; 428/901
(58) Field of Search ..................................... 361/748, 749, 361/761, 763, 764, 773, 774, 782, 783, 792, 795, 760, 762, 767, 768, 793; 257/668, 700, 701–703, 723, 724, 737, 738, 686, 778; 174/256, 258, 260, 262, 263, 264; 438/612, 613, 108, 109, 125–127; 428/209–211, 321.3, 304.4, 901; 427/97; 216/18, 19; 29/829, 830, 846, 852, 832, 840, 841

(56) References Cited

U.S. PATENT DOCUMENTS 3,770,529 * 11/1973 Anderson ................................. 216/18
3,852,877 * 12/1974 Ahn et al. ............................... 29/830

(List continued on next page.)

FOREIGN PATENT DOCUMENTS

| 33 46 461 | 7/1985 | (DE) . |
|---|---|---|
| A-4022829 | 1/1992 | (DE) . |
| 0 607 532 | 7/1994 | (EP) . |
| A-586069 | 9/1994 | (EP) . |
| 0 645 951 | 3/1995 | (EP) . |
| 59-181650 | 10/1984 | (JP) . |
| 60-57999 | 4/1985 | (JP) . |
| 62-156847 | 7/1987 | (JP) . |

(List continued on next page.)

OTHER PUBLICATIONS

Patent Abstracts of Japan, 15(86) (E–1039), Feb. 28, 1991 & JP 02 301182 A, Dec. 13, 1990.

(List continued on next page.)

Primary Examiner—Jeffrey Gaffin
Assistant Examiner—John B. Vigushin
(74) Attorney, Agent, or Firm—Morrison & Foerster LLP

(57) ABSTRACT

A printed wiring board (PWB) and assembly are described which are suitable for high density mounting of an electronic component and which can provide a thin and light assembly. A recess is formed in one part of a PWB and components are received in this recess. The components are lower than the surface of the PWB. A conductive pad is provided to the bottom of the recess and a connecting terminal and the conductive pad are electrically connected by using a solder ball or a conductive adhesive material. The recess is formed by partially removing one or more layers of plural conductive layers and insulating layers which make up the multi-layer PWB.

4 Claims, 19 Drawing Sheets

U.S. PATENT DOCUMENTS

| | | | |
|---|---|---|---|
| 4,080,513 | * 3/1978 | Cuneo et al. | 174/256 |
| 4,188,513 | 2/1980 | Morrell et al. | 381/111 |
| 4,417,413 | 11/1983 | Hoppe et al. | 29/832 |
| 4,663,215 | * 5/1987 | Dubuisson et al. | 428/209 |
| 4,677,528 | 6/1987 | Miniet | 361/764 |
| 4,770,922 | * 9/1988 | Hatakeyama et al. | 428/211 |
| 4,829,666 | 5/1989 | Haghiri-Tehrani et al. | 257/679 |
| 4,871,608 | * 10/1989 | Kondo et al. | 428/209 |
| 4,897,918 | * 2/1990 | Osaka et al. | 29/830 |
| 4,964,019 | 10/1990 | Belanger, Jr. | 361/764 |
| 5,116,440 | 5/1992 | Takeguchi et al. | 156/90 |
| 5,139,851 | * 8/1992 | Acocella et al. | 428/209 |
| 5,139,852 | * 8/1992 | Baise et al. | 428/209 |
| 5,274,701 | 12/1993 | Schmidt et al. | 379/375 |
| 5,346,750 | 9/1994 | Hatakeyama et al. | 428/209 |
| 5,384,689 | 1/1995 | Shen | 361/761 |
| 5,386,343 | 1/1995 | Pao | 361/761 |
| 5,396,034 | * 3/1995 | Fujita et al. | 361/795 |
| 5,468,999 | 11/1995 | Lin et al. | 257/738 |
| 5,481,795 | 1/1996 | Hatakeyama et al. | 29/852 |
| 5,484,647 | 1/1996 | Nakatani et al. | 428/209 |
| 5,506,448 | * 4/1996 | Morishige | 257/701 |
| 5,541,450 | 7/1996 | Jones et al. | 257/738 |
| 5,550,403 | 8/1996 | Carichner | 257/702 |
| 5,558,928 | 9/1996 | DiStefano et al. | 428/209 |
| 5,562,971 | 10/1996 | Tsuru et al. | 428/209 |
| 5,578,796 | 11/1996 | Bhatt et al. | 361/761 |
| 5,583,376 | 12/1996 | Sickler et al. | 257/702 |
| 5,600,541 | 2/1997 | Bone et al. | 361/761 |
| 5,616,888 | 4/1997 | McLaughlin et al. | 361/764 |
| 5,628,919 | 5/1997 | Tomura et al. | 216/18 |
| 5,635,301 | * 6/1997 | Kondo et al. | 428/209 |
| 5,646,828 | * 7/1997 | Degani et al. | 361/761 |
| 5,650,918 | 7/1997 | Suzuki | 361/764 |
| 5,701,233 | 12/1997 | Carson et al. | 361/761 |
| 5,719,438 | 2/1998 | Beilstein, Jr. et al. | 257/724 |
| 5,729,894 | * 3/1998 | Rostoker et al. | 29/832 |
| 5,731,227 | * 3/1998 | Thomas | 438/125 |
| 5,763,947 | 6/1998 | Bartley | 361/774 |
| 5,972,482 | 10/1999 | Hatakeyama et al. | 428/209 |
| 6,029,343 | * 2/2000 | Wieloch | 29/830 |

FOREIGN PATENT DOCUMENTS

| | | |
|---|---|---|
| 1-93198 | 4/1989 | (JP) . |
| 2-301183 | 12/1990 | (JP) . |
| 3-230597 | 10/1991 | (JP) . |
| 4-079360A | 3/1992 | (JP) . |
| 4-212446A | 8/1992 | (JP) . |
| 4-263493 | 9/1992 | (JP) . |
| 5-29747 | 2/1993 | (JP) . |
| 5-082710A | 4/1993 | (JP) . |
| 5-109952A | 4/1993 | (JP) . |
| 5-160540 | 6/1993 | (JP) . |
| 5-275611A | 10/1993 | (JP) . |
| 5-315337 | 11/1993 | (JP) . |
| 6-6043 | 1/1994 | (JP) . |
| 6-120670 | 4/1994 | (JP) . |
| 7-30059 | 1/1995 | (JP) . |
| 7-254766 | 10/1995 | (JP) . |
| 7-283335 | 10/1995 | (JP) . |
| A-9503683 | 2/1995 | (WO) . |

OTHER PUBLICATIONS

Patent Abstracts of Japan, 9(31) (E–295), Feb. 9, 1985 & JP 59 175150 A, Oct. 3, 1984.

Patent Abstracts of Japan, 17(676) (E–1475), Dec. 13, 1993 & JP 05 226803 A, Sep. 3, 1993.

Patent Abstracts of Japan, 14(278) (E–0941), Jun. 15, 1990 & JP 02 087695 A, Mar. 28, 1990.

Patent Abstracts of Japan, 14(94) (E–0919), Apr. 20, 1990 & JP 02 039587 A, Feb. 8, 1990.

Patent Abstracts of Japan, 15(22) (E–1024), Jan. 18, 1991 & JP 02 268489 A, Nov. 2, 1990.

Patent Abstracts of Japan, 15(22) (E–1024), Jan. 18, 1991 & JP 02 268490 A, Nov. 2, 1990.

Database WPI, Week 8536, Derwent Publications Ltd., London, GB AN 85–221479 XP002071894 and JP 53 070 425 abstract.

Leonard Morton et al Motorola, Inc. "Low Profile IC Packaging Method", 8182 Motorola Technical Developments May 15, 1992, p. 166.

* cited by examiner

PRINTED WIRING BOARD AND ASSEMBLY OF THE SAME

This application is a con of application Ser. No. 08/745,560 filed Nov. 8, 1996, now abandoned.

FIELD OF THE INVENTION

This invention relates to a printed wiring board (PWB) for mounting a component including an electronic circuit, and an assembly of the same.

BACKGROUND OF THE INVENTION

As portable electronic equipment has become smaller and thinner, the mounting density of electronic components, such as semiconductor devices, resistors, capacitors, on PWBs has increased remarkably. Multilayer PWBs enable high-density mounting of such electronic components. A multilayer PWB, for example, is formed by laminating plural PWBs on which conductive circuit patterns are previously formed, and connecting the circuit patterns of the PWBs with each other by a via hole.

Published Unexamined Japanese Patent Application (Tokkai-Sho) No. 60-57999 discloses a multilayer wiring board, where the inner layer patterns of the laminated PWBs are partially exposed in step-wise, and a conductive pad is connected to the exposed conductive patterns. In a general multilayer wiring board, a conductive pad is provided only to the outer layer, therefore, many via holes are necessary to connect the exterior patterns and the inner layer patterns. On the other hand, the multilayer wiring board disclosed in this reference can reduce the number of the via holes by providing another conductive pad to the exposed portion of the inner layer. This reference, however, does not disclose how to connect the conductive pad provided to the exposed portion of the inner layer to the electronic component, or how to produce such a multilayer wiring board.

Published Examined Japanese Patent Application (Tokkoh-Hei) No. 5-41039 discloses a PWB, where a recess is provided by counterbore processing, and a semiconductor device is placed in the recess. The semiconductor device and the conductive pad of every layer are connected by a bonding wire, and sealed with resin. In this way, the semiconductor device is contained without substantially exceeding the thickness of the PWB. This method depends on connection by the bonding wires, and thus, this reference does not disclose application of the method to a surface mounting technology (SMT).

FIG. 16 is a cross-sectional view to show the PWB 31 to which a component 32 such as an integrated circuit is mounted by conventional surface mounting technology. Since a lead pin 32a of the component 32 is soldered to the conductive pad 33 on the PWB 31, the component 32 is electrically connected and fixed to the PWB 31.

FIG. 17 shows an example where a component 34, such as a speaker, is mounted on the surface of the PWB 31. The component 34 is fixed on the PWB 31 by an adhesive tape 35, while the lead wire 34a from the component 34 is soldered to the conductive pad 33 on the PWB 31.

In a PWB assembly using SMT, the mounting area is reduced due to the high density trend, however, the assembly has not decreased significantly in thickness. Especially, when a comparatively large component such as a package semiconductor (e.g. IC, LSI), a speaker, or a microphone is mounted, the component becomes much higher than the surface of the wiring board.

Therefore, an assembly using a conventional multilayer PWB does not meet the requirements for thin portable electronic equipment. If the assembly is thick, the portable electronic equipment cannot be thin, and the design of such electronic equipment will be limited. Reduction of the assembly's weight is another important aim.

SUMMARY OF THE INVENTION

This invention aims to provide a thin and light multilayer PWB and an assembly of the same in order to solve the above-identified problems of the conventional techniques.

A first PWB assembly of this invention comprises a PWB having an opening for receiving a component that includes an electronic circuit, and a component placed in the opening, which is substantially thinner than the PWB and is electrically connected to the PWB. As a result, a thin assembly can be provided. If a second component is mounted on the component which is received in the opening, or if the second component is mounted stretching over the first component and the PWB, other advantages can be obtained. For instance, the PWB area can be reduced. The other preferable embodiments according to this configuration will be explained below.

In a second PWB assembly of this invention, a component including an electronic circuit is placed in a recess formed in the PWB, and a connecting terminal provided to the bottom of the component is electrically connected to the conductive pad formed on the bottom of the recess by using a conductive adhesive layer. Examples of such an adhesive layer include a solder ball or a two-step protruded electrode and conductive adhesive. According to this configuration, a thin assembly can be provided, and a plurality of components can be mounted on the recess with a high density.

Such a recess for receiving a component can be formed by partially removing one or more layers of the plural conductive layers and insulating layers that comprise the multilayer PWB. More specifically, the process for producing such a PWB comprises the steps of:

a) preparing plural double-sided conductive layer boards manufactured by sandwiching an insulating layer between two conductive layers, and preparing at least one insulating layer board to be placed between the double-sided conductive layer boards;

b) forming holes in each board of step a) for electric connection between the conductive layers, and forming a hole that defines a recess for receiving a component in all but at least one board;

c) etching the conductive layers of the double-sided conductive layer boards of step b), so that a predetermined circuit pattern is left;

d) electrically connecting the conductive layers of the etched double-sided conductive layer boards of step c); and e) laminating the double-sided conductive layer boards and at least one insulating layer board with holes aligned so as to form electric connection between the conductive layers and to form a recess for receiving the component, and heatpressing the laminate.

In a PWB assembly provided with a recess for component receiving, other embodiments can be used as the assembly having the opening, for instance, two components can be mounted one after another.

It is preferable that the insulating layer board be made of a compressible base material impregnated with resin, so that weight can be minimized. In addition, the electrical resistance is reduced and stabilized when the conductive layers are electrically connected to each other by filling the hole for electrical connection formed on the compressible porous material with conductive paste. The detail is explained below.

A third PWB assembly of this invention comprises a PWB having a recess, a vibration film provided to cover the recess, and a coiled conductive pattern placed opposing to the vibration film, so as to perform conversion between vibration of the vibration film and electric current flowing in the coiled conductive pattern. According to this configuration, it is possible to integrally form a speaker or a microphone with a PWB. In other words, the weight and cost can be reduced considerably compared to a case that the other component like a speaker or a microphone is mounted on the PWB. Various embodiments of this configuration will be mentioned in detail.

In another configuration, a PWB comprises a recess or an opening formed on the PWB in order to integrally form a speaker or a microphone with the PWB, a vibration film provided to cover the recess or the opening, a coiled conductive pattern provided to the vibration film, and a magnet placed opposing to the vibration film, so as to perform conversion between vibration of the vibration film and electric current flowing in the coiled conductive pattern.

DETAILED DESCRIPTION OF THE INVENTION

Preferable embodiments of this invention are explained below in detail, referring to FIGS. 1–15 and 18.

Figure 1:
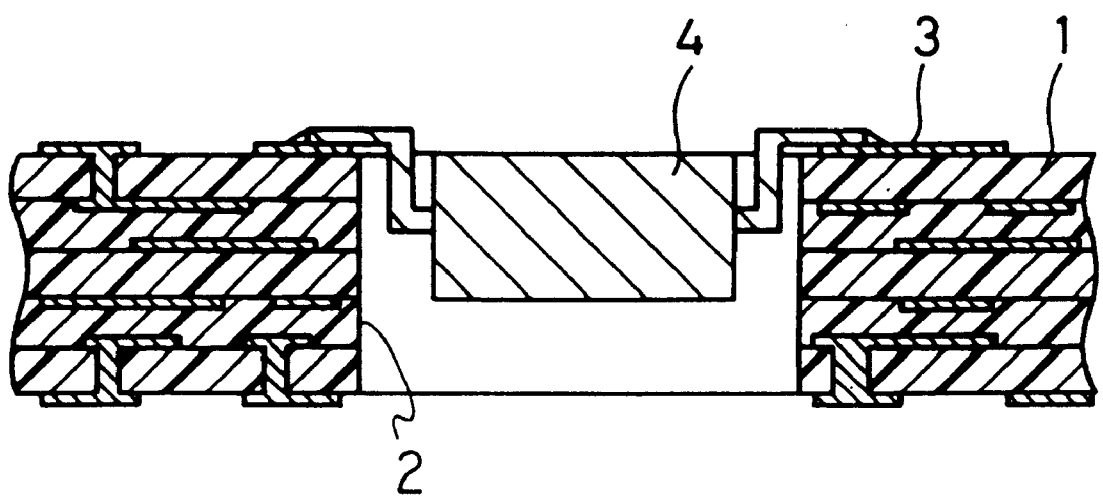
FIG. 1 is a cross-sectional view to show a PWB assembly in a first embodiment of this invention.

FIG. 1 is a cross-sectional view to show a PWB assembly of the first embodiment of this invention. The PWB 1 comprises an opening 2, and a component 4 is received in the opening 2. As shown in FIG. 1, the component 4 is thinner than the PWB 1. The lead pins extending from the component 4 are electrically connected to the conductive pad 3 on the PWB 1 by soldering.

The PWB 1 of this embodiment has an inner via hole (IVH) structure where six conductive layers and five insulating layers are laminated alternately and the layers are electrically connected to each other by a through hole (a via hole). This PWB can be produced in the following process.

First, a pre-impregnation is prepared by impregnating a nonwoven cloth of aramid fiber with uncured epoxy resin. The pre-impregnation sandwiched by two copper foils is heat-pressed for about one hour in the condition of 180° C., 40 Kg/cm$^2$, so that a double-sided copper-clad laminated board (a core board) is produced. Next, the copper-clad laminated board is provided with a hole. A hole of about 0.2–0.4 mm in diameter is drilled for a through hole. An opening for component receiving is also formed by punch-pressing or router-pressing using an end mill. In this way, an opening of the component size is formed.

Next, pattern-etching is conducted to remove the copper foils, though the copper foils are partially left for the formed hole. A photolithography method is generally used for the pattern etching of a high density PWB. In this method, the wiring pattern is printed on the core board to which a dry film is stuck, by using a mask film on which the wiring pattern is printed. Later, unnecessary dry film and copper foils are melted and removed, and thus, a desirable copper foil pattern is obtained.

Both sides of the PWB are completely pattern-etched, and the whole parts of the PWB are copper-plated. Thus, the inner wall of the through hole is also copper-plated, so that the conductive layers are electrically connected to each other. The conductive layers also can be electrically connected to each other by other methods. For example, the layers can be electrically connected by filling conductive paste (a half-kneaded mixture of resin and powder of silver, copper etc.) in the hole for electric connection. If the layers are electrically connected to each other by such a conductive paste, the heat-pressing can be omitted during the process for producing the double-sided copper-clad laminated board. Heat-pressing is carried out in the end.

Three kinds of core boards are prepared by forming predetermined copper-foil patterns on both sides. These three core boards and two pre-impregnation for insulating layers are laminated alternately, and heat-pressed for about one hour at 180° C., 40 Kg/cm$^2$. In this manner, a multilayer PWB where six copper foil patterns and five insulating layers are laminated alternately is provided. The multilayer PWB is about 0.3 to 2.0 mm thick. An opening is formed on the pre-impregnation to be sandwiched between the core boards in order to correspond to the opening of the core boards. Such an opening in the pre-impregnation is also formed by a punch-pressing or a router processing using an end mill.

Next, conductive layers are provided with a hole if they are not adjacent to each other and need to be electrically connected. Then, the inner wall of the through hole is plated and electrically connected. After that, a solder resist film is printed on the PWB if necessary. In this manner, a component is mounted on the completed multilayer PWB. In a surface mounting technology (SMT), a solder paste is applied to the conductive pad of the PWB by printing, and a connecting terminal of the component is put thereon. The conductive pad is heated at 200° C. or higher by passing through a reflow furnace, and thus, the component terminal and the conductive pad are connected to each other by melting the solder.

As the comparatively big component 4 is received in the opening of the multilayer PWB 1, the thickness of the assembly is not substantially increased after mounting the component. Therefore, it is possible to reduce the thickness of the electronic equipment in which this PWB assembly is received. In addition, a light assembly can be provided in this embodiment, since the weight of the PWB is reduced by the volume of the opening.

Figure 18:
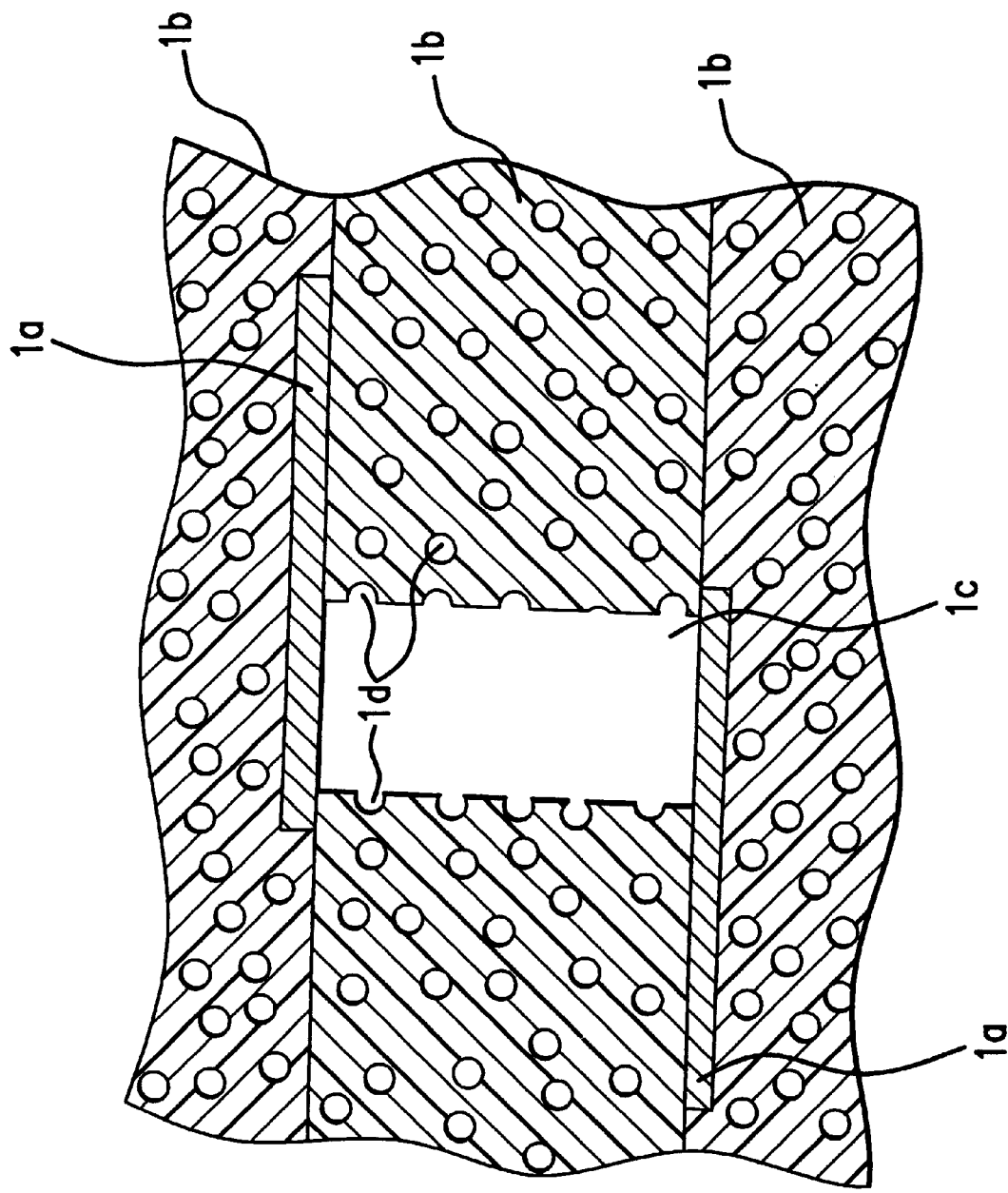
FIG. 18 is a cross-sectional view to show the binder in the conductive paste is absorbed in the porous material of the insulating material through the via hole wall.

The above-mentioned compressible porous material in which resin is impregnated is used as the insulating material, so that the weight of the PWB itself is considerably reduced compared to the case using other boards such as ceramics. When the conductive layers are electrically connected to each other (via hole connection) by filling conductive paste in the hole on the compressible porous material, the binder in the conductive paste is easily absorbed in the porous material through the hole wall as shown in FIG. 18, which shows a metal layer 1a, a porous insulating material 1b, a via-hole 1c and pores of the porous insulating material 1d. As a result, electric resistance at the via hole is decreased after heating-compression, and the electric connection between the conductive layers is stabilized.

In some cases as mentioned below, it is preferable that the surface of the component received in the opening of the PWB and the surface of the same board are flush. In such a case, a compressible porous material is used for the insulating layer, so that the compressive rate is adjusted during heating-compressive process. As a result, the component surface and the surface of the PWB become flush since the thickness of the PWB can be easily adjusted for the component.

Figure 2:
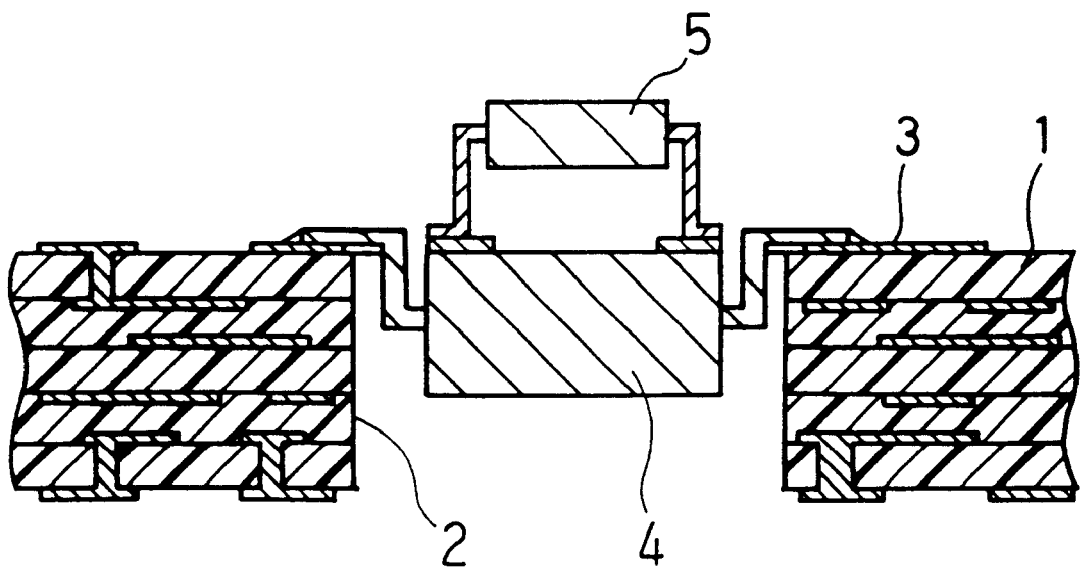
FIG. 2 is a cross-sectional view to show a variation of PWB assembly of FIG. 1.

FIGS. 2–6 show the variations of PWBs, in which the components are received in the PWBs openings and the components are thinner than the PWBs. FIG. 2 shows a variation in which a second component 5 is mounted on the first component 4 which is received in the opening 2 of the PWB 1. If plural components are piled up as indicated in this drawing, several effects will be obtained, for instance, the mounting area can be reduced. In this invention, the level difference between the surface of the assembly and the PWB can be reduced.

Figure 3:
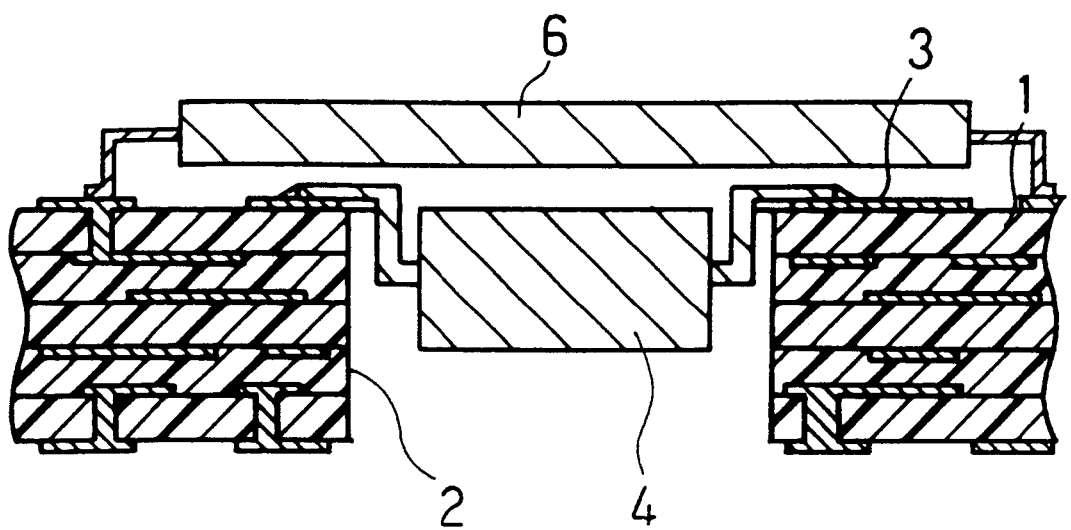
FIG. 3 is a cross-sectional view to show another variation of PWB assembly of FIG. 1.

FIG. 3 shows another variation in which a second component 6 is mounted stretching over the first component 4 received in the opening 2 of the PWB 1. In a conventional technique, the first component 4 should be low and the second component 6 should have long legs for this mounting method. In this invention, however, such a mounting can be conducted easily even if the first component 4 is high.

Figure 4:
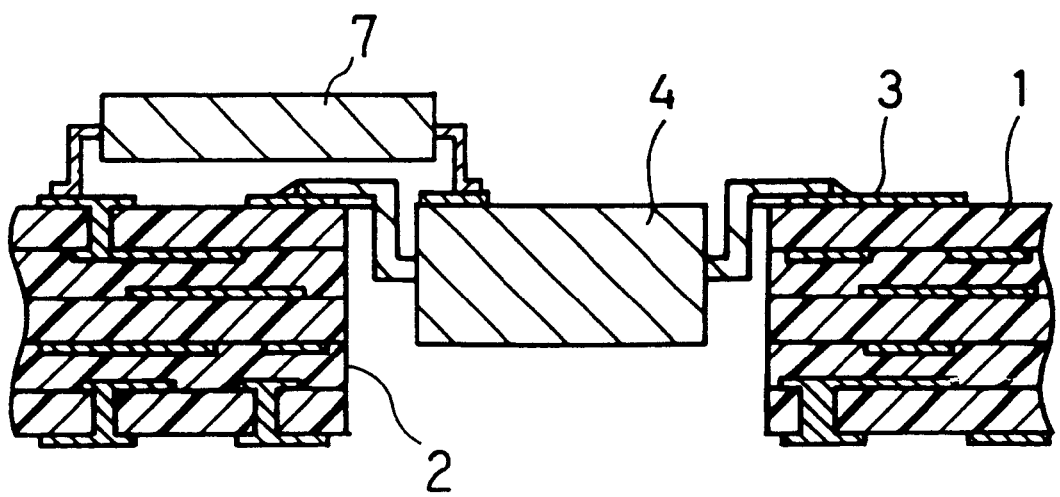
FIG. 4 is a cross-sectional view to show still another variation of PWB assembly of FIG. 1.

FIG. 4 shows another variation in which a second component 7 is mounted stretching over the first component 4 received in the opening 2 of the PWB 1 and the PWB itself. In a conventional technique, such a mounting will be difficult if the surface of the first component 4 is higher or lower than the surface of the PWB 1. However, it is rather easy in this invention. Therefore, it is preferable that the surface of the first component 4 is substantially flat and it is flush with the surface of the PWB 1.

Figure 5:
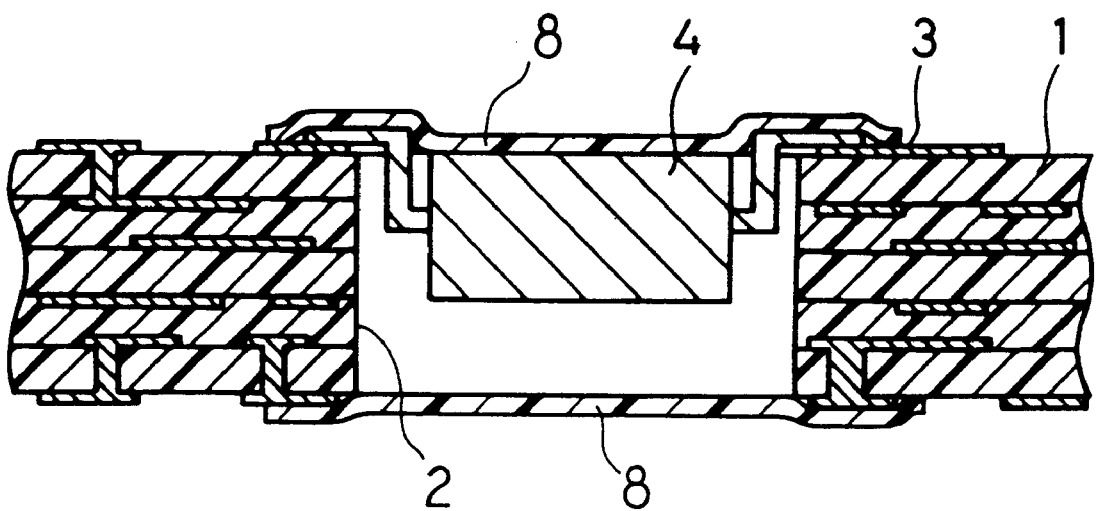
FIG. 5 is a cross-sectional view to show still another variation of PWB assembly of FIG. 1.

FIG. 5 shows a variation in which the opening 2 is covered with a sheet member 8 after the component 4 is received in the opening 2 of the PWB 1. The sheet member 8 can have functions such as electric insulation, electromagnetic shield, heat sink, and moistureproof in order to compensate for the weak points of the component 4. As a result, several effects can be obtained, for example, the component 4 is electrically insulated from outside, effect of unnecessary radiation is controlled, or the temperature increase of the component 4 is controlled. In addition, a second component (not shown) can be placed on the sheet member 8. In FIG. 5, the sheet members 8 are provided to the surface and back of the opening of the PWB, however, one of the sheet members may be omitted.

Figure 6:
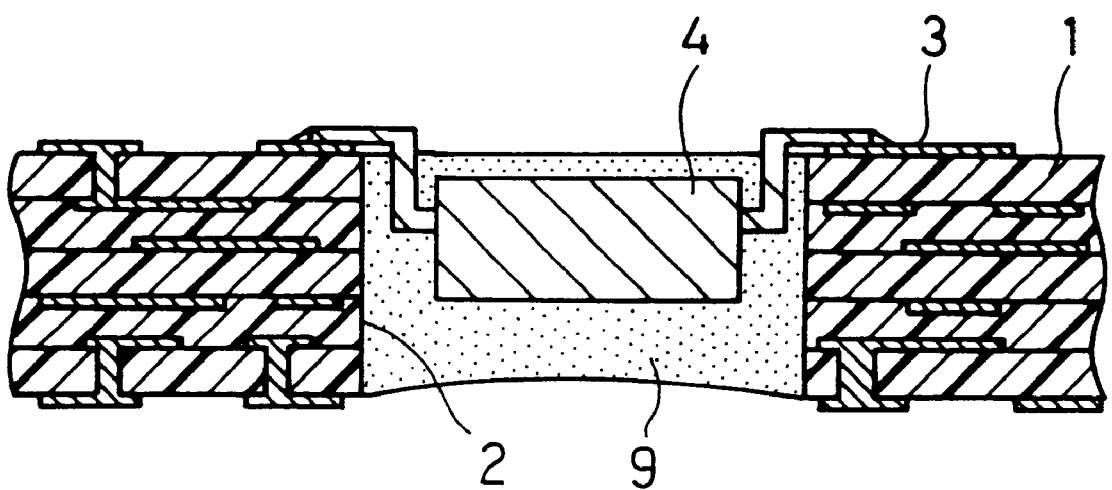
FIG. 6 is a cross-sectional view to show still another variation of PWB assembly of FIG. 1.

FIG. 6 shows another variation in which a sealing resin 9 is filled in the opening 2 after the component 4 is received in the opening 2 of the PWB 1. By filling the sealing resin, the component 4 is fixed more strictly to the PWB 1 and the electric connection is stabilized. Another effect is that the component 4 is protected from moisture.

In the above-mentioned embodiment and its variations, the multilayer PWBs can be replaced by one-sided PWBs or double-sided PWBs.

In the above-mentioned embodiment and its variations, conductive pads for electric connection between the components and the PWBs are placed only on the front side of the PWBS. Such a conductive pad can also be placed on the back side of a multilayer PWB or a double-sided PWB. For instance, when a PWB has a component in its opening and lead pins extend from the both sides, the lead pins can be connected to the conductive pads on the front side and backside of the PWB.

In the above-mentioned embodiment and its variations, the components and the PWBs can be electrically connected by conductive pads placed on the inner layers, not by the conductive pads on the PWBs. For instance, the opening may be formed with a stair-shape cross-section so that the conductive layer of the inner layer is partially exposed for connection to the conductive pad. In this way, the component received in the opening of the PWB will be thinner than the PWB, even if it includes the parts for electrical connection with the PWB. Another advantage is that the component having the electrical connection can be completely sealed with resin when the opening is filled with the sealing resin.

Figure 7:
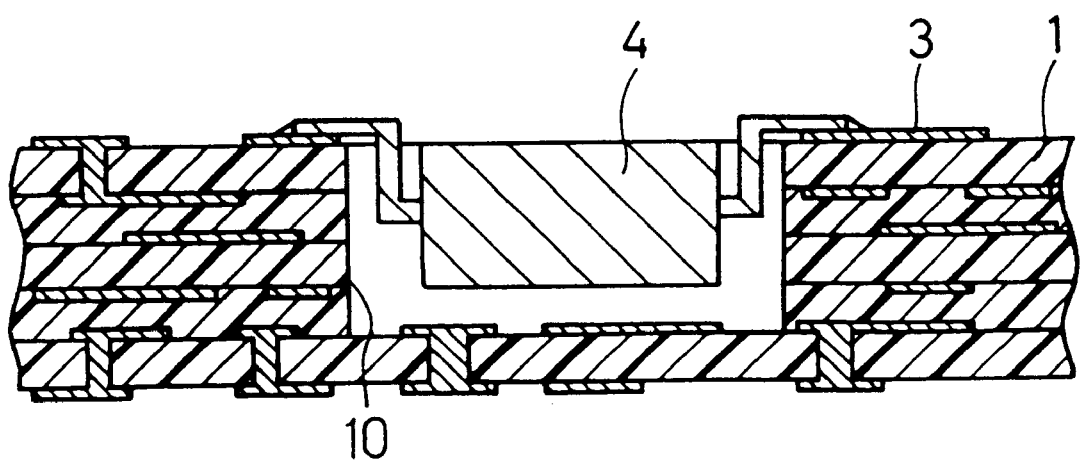
FIG. 7 is a cross-sectional view to show a PWB assembly in a second embodiment of this invention.

FIG. 7 shows a cross-section of a PWB assembly in the second embodiment of this invention. The PWB 1 has a recess 10 to receive the component 4. Though such a recess can be formed by counterbore processing, another method, which is effective and excellent in mass-productivity can be chosen for a multilayer substrate. The recess 10 (see FIG. 7) of the multilayer PWB having six conductive layers and five insulating layers is formed by partially removing the four conductive layers and four insulating layers, and two conductive layers and one insulating layer are left.

For instance, in a method for producing a PWB explained in the first embodiment, the recess 10 can be formed by previously forming an opening sized to receive the component 4 in the core board and pre-impregnation excluding one core board, when a six patterned multilayer PWB is produced by laminating alternately three core board formed with double-sided copper foil patterns and two pre-impregnation.

This embodiment is especially suitable for a case in which the component 4 should not be exposed from the back side of the PWB. In this embodiment, a light assembly can be provided as in the first embodiment, by preventing the surface of the component 4 from being exposed from the surface of the PWB 1, more preferably, by forming the component 4 and the PWB 1 to be flush. The variations (FIGS. 2–6) in the first embodiment can be used in this embodiment, too. In other words, the above-mentioned effects can be obtained by, for example, mounting another component on the component mounted on the recess, by mounting a component on the recess and covering the recess with a sheet member, or by filling a sealing resin in the recess.

Figure 8:
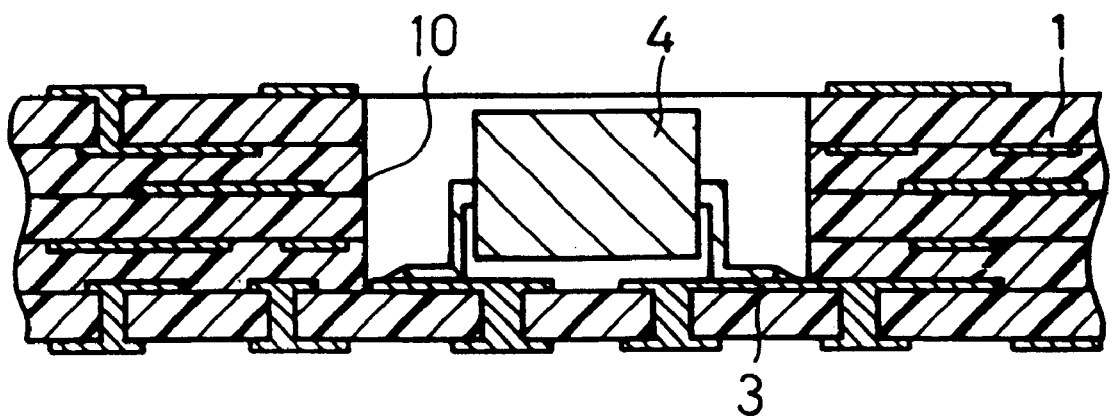
FIG. 8 is a cross-sectional view to show a variation of PWB assembly of FIG. 7.
Figure 9:
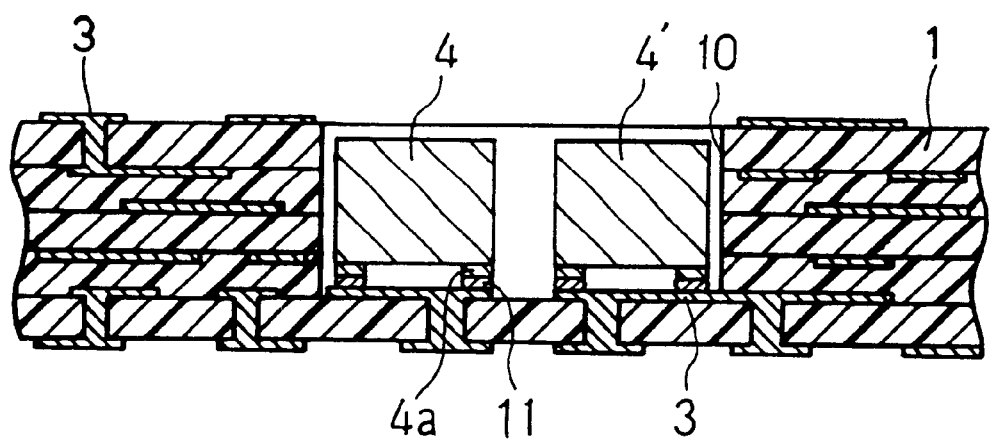
FIG. 9 is a cross-sectional view to show another variation of PWB assembly of FIG. 7.
Figure 10:
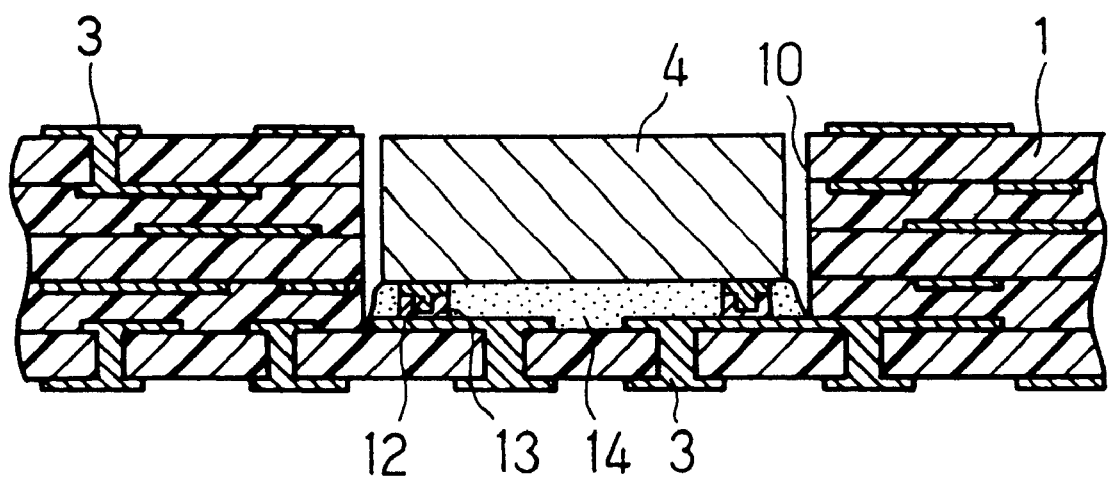
FIG. 10 is a cross-sectional view to show still another variation of PWB assembly of FIG. 7.

The other variations of this embodiment are shown in FIGS. 8–10. Though in FIG. 7, the conductive pad 3 to which the lead pins of the component 4 are electrically connected is formed on the PWB 1 as same as the first embodiment, in FIGS. 8–10, the conductive pads are formed on the exposed faces of the inner layers of the PWBs, namely, the conductive pads 3 are formed on the bottom of the recess 10.

In FIG. 8, the lead pins of the component 4 are soldered to the conductive pad 3 on the bottom of the recess. As mentioned in the first embodiment, the lead pins can be soldered by using solder paste at the same time that the other surface mounting components are soldered.

In FIGS. 9 and 10, the component 4 is provided with a terminal 4a for electrical connection on its bottom, instead of lead pins. This connecting terminal 4a is electrically connected by using an adhesive layer to the conductive pad 3 placed on the bottom of the recess 10 of the PWB 1. The adhesive layer is, for example, a solder ball or a conductive adhesive. The advantage of this mounting method is that plural components (4, 4') can be mounted with high density on the recess as shown in FIG. 9, and thus, it is suitable for bare chip mounting of a semiconductor.

In FIG. 9, the connecting terminal 4a of the component and the conductive pad 3 are electrically connected through a solder ball 11. The solder ball is set on the conductive pad 3, and the component 4 is temporarily fixed so that its terminal will be positioned on the soldering ball. As a result, the terminal of the component 4 and the conductive pad 3 are connected to each other by melting the solder ball.

Figure 10A:
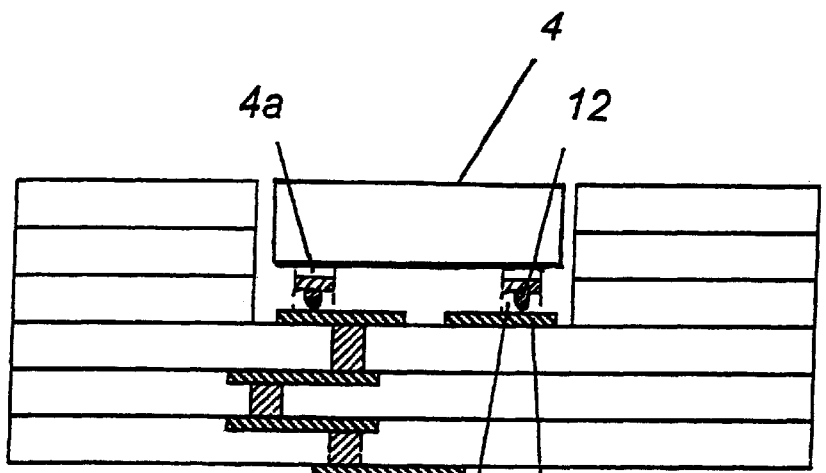
FIGS. 10a and 10b are cross-sectional views exemplifying an embodiment of this invention.
Figure 10B:
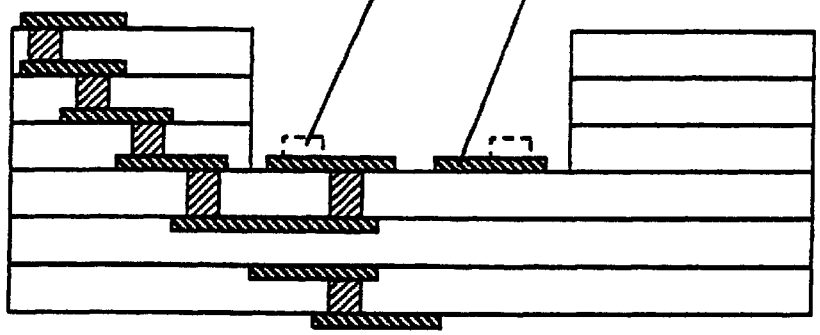

In FIGS. 10, 10a and 10b, the connecting terminal 4a and the conductive pad 3 are electrically connected to each other by using a two-stage protruding electrode 12 and by using a conductive adhesive 13. Such a connecting method is called stud bump bonding (SBB). In FIGS. 10 and 10a, the two-stage protruding electrode 12 is adhered to the terminal side of the component 4, and the conductive adhesive 13 is applied between the protruding electrode 12 and the conductive pad 3. Otherwise the conductive adhesive can be applied between the component terminal and the protruding electrode after the protruding electrode is adhered to the conductive pad side of the PWB. An adhesive resin 14 is filled between the bottom of the component 4 and the bottom of the recess 10 of the PWB 1 in order to improve the fixing strength.

Figure 11:
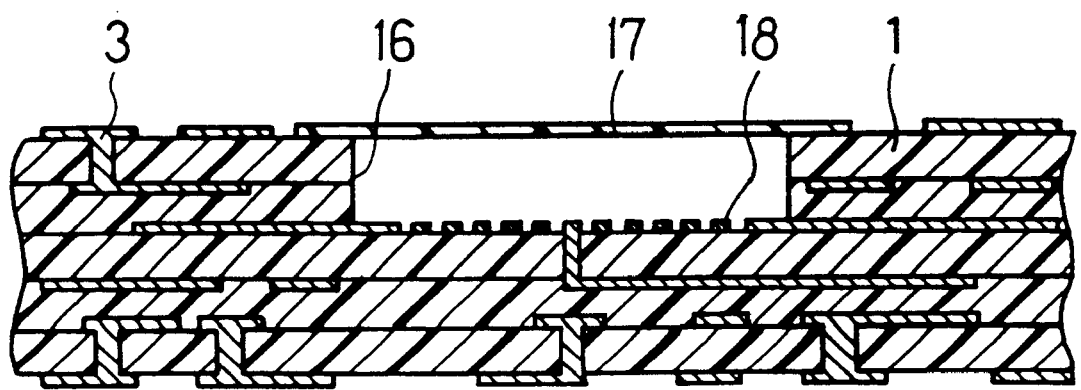
FIG. 11 is a cross-sectional view to show a PWB assembly in a third embodiment of this invention.

FIG. 11 shows the cross section of the PWB assembly in a third embodiment of this invention. In this embodiment, a speaker (or a microphone) is composed of a recess 16 formed on the PWB 1, a magnetic vibration film 17 placed to cover this recess, and a coiled conductive pattern 18 formed opposing to the magnetic vibration film 17.

Figure 12:
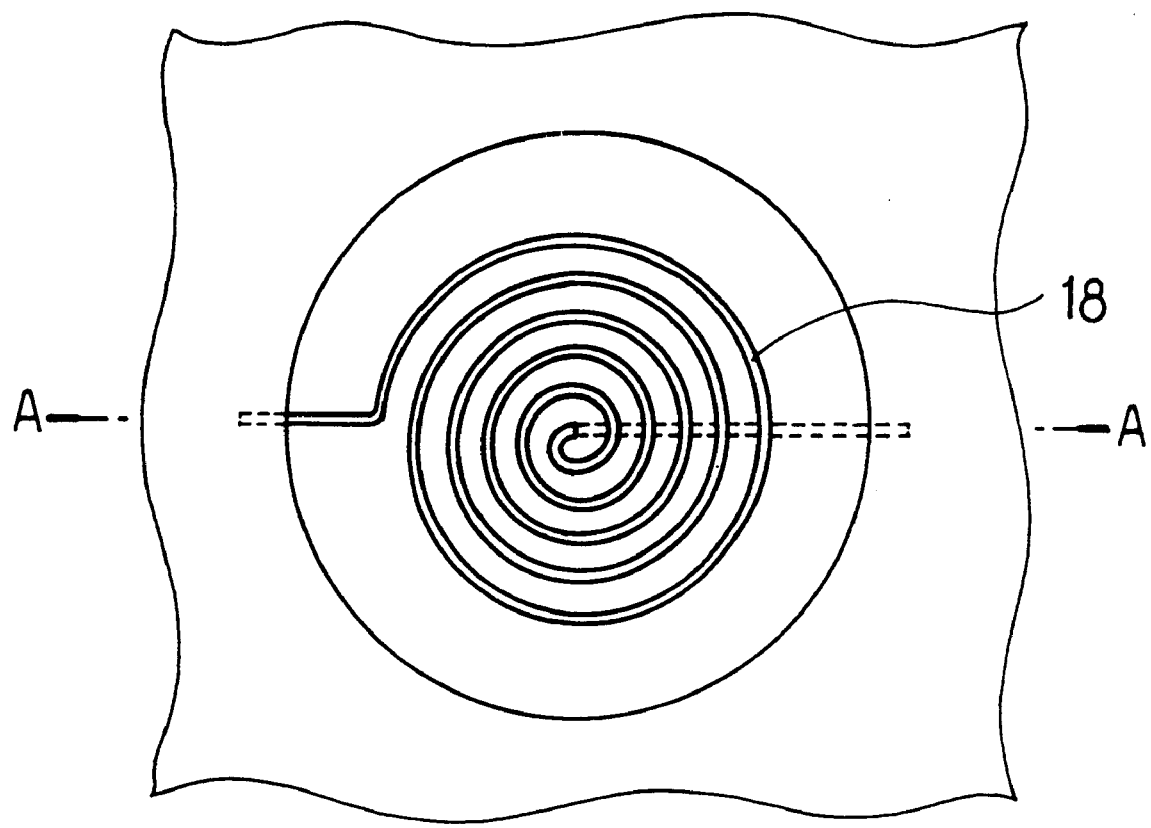
FIG. 12 is a plan view to show a coiled conductive pattern of the PWB assembly of FIG. 11.

The coiled pattern 18 can be formed by using the copper foil of the PWB 1 as shown in the plan view of FIG. 12. The magnetic vibration film 17 can be made by applying magnetic coating to plastic films such as polyethylene teraphthalate (PET), polyethylene naphthalate (PEN) or aramid, paper or nonwoven cloth, etc. Instead of applying the magnetic coating, magnetic powder can be added to the material of the plastic film. The periphery of the circular magnetic vibration film 17 is adhered to the periphery of the recess 16 of the PWB 1 by using heat or adhesive materials.

When alternating current signal flows into the coiled pattern 18, alternating flux generated by the signal crosses the magnetic vibration film 17, and thus, the magnetic vibration film 17 vibrates. In this manner, a speaker to convert the electric signal to the film vibration is provided. On the contrary, when the magnetized magnetic vibration film 17 vibrates, the magnetic flux interlinking with the coiled pattern 18 changes. As a result, alternating current flows in the coiled pattern 18. In this manner, a microphone to convert film vibration to electric current is provided.

Figure 13:
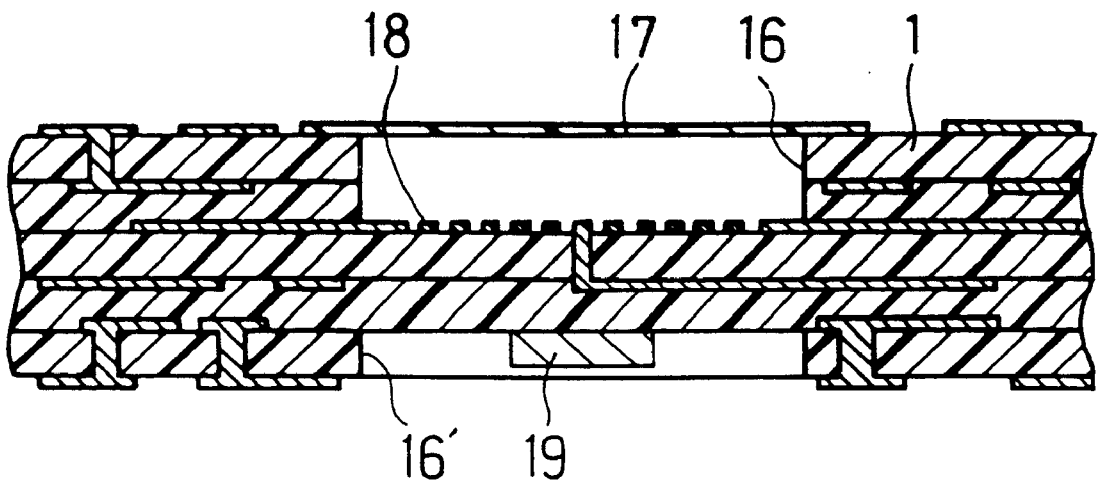
FIG. 13 is a cross-sectional view to show a variation of PWB assembly of FIG. 11.

As a variation shown in FIG. 13, the magnetic vibration film 17 does not need to be magnetized if another recess 16 is provided to the backside of the PWB 1 and a magnet 19 is placed thereon. Namely, a magnetic type speaker or microphone is composed of a magnetic vibration film 17, a coiled pattern 18 and a magnet 19. In such a speaker or a microphone, magnetic field due to the magnet 7 changes as the magnetic vibration film 18 vibrates, and thus, alternating current is generated in the coiled pattern. Otherwise, the magnetic vibration film 8 vibrates due to the alternating current flowing in the coiled pattern. The magnet 19 is adhered to the bottom of the recess 16' of the PWB 1 by using an epoxy-based adhesive.

Figure 14:
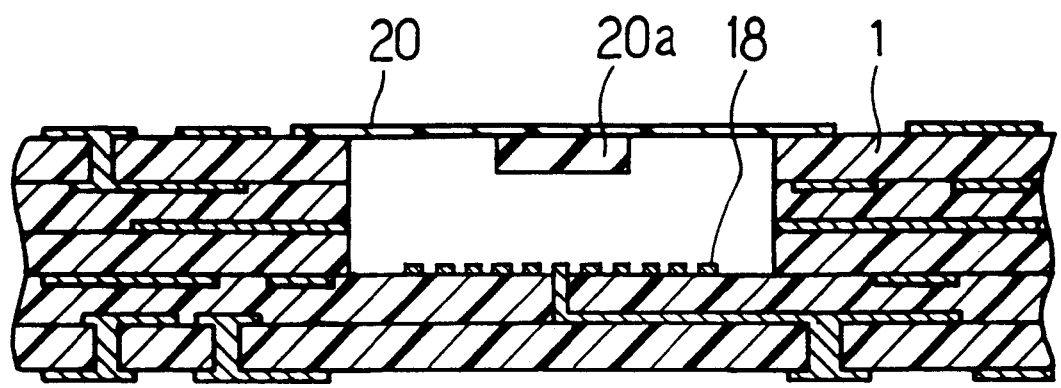
FIG. 14 is a cross-sectional view to show another variation of PWB assembly of FIG. 11.

In another variation shown in FIG. 14, a thin magnet (e.g. a rubber magnet) 20a is adhered to an nonmagnetic vibration film 20 comprising plastic films, so that the function of the film is as the same as that of the above-mentioned magnetized magnetic vibration film. Therefore, in this case, a so-called moving magnet (MM) type speaker or microphone is provided.

Figure 15:
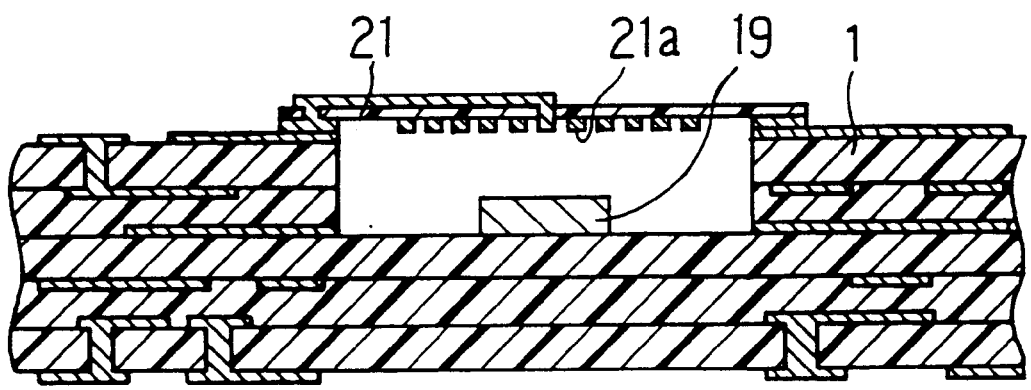
FIG. 15 is a cross-sectional view to show still another variation of PWB assembly of FIG. 11.
Figure 16:
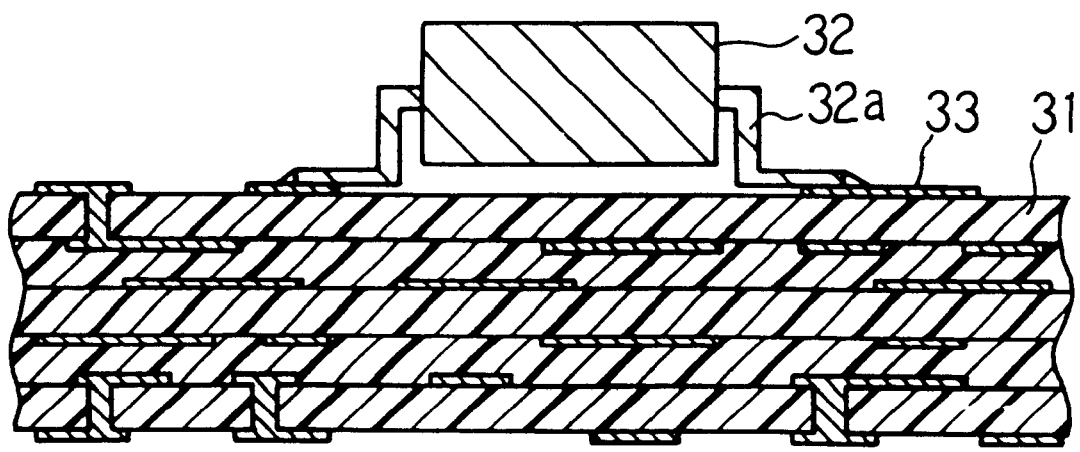
FIG. 16 is a cross-sectional view to show an example of a conventional PWB assembly.
Figure 17:
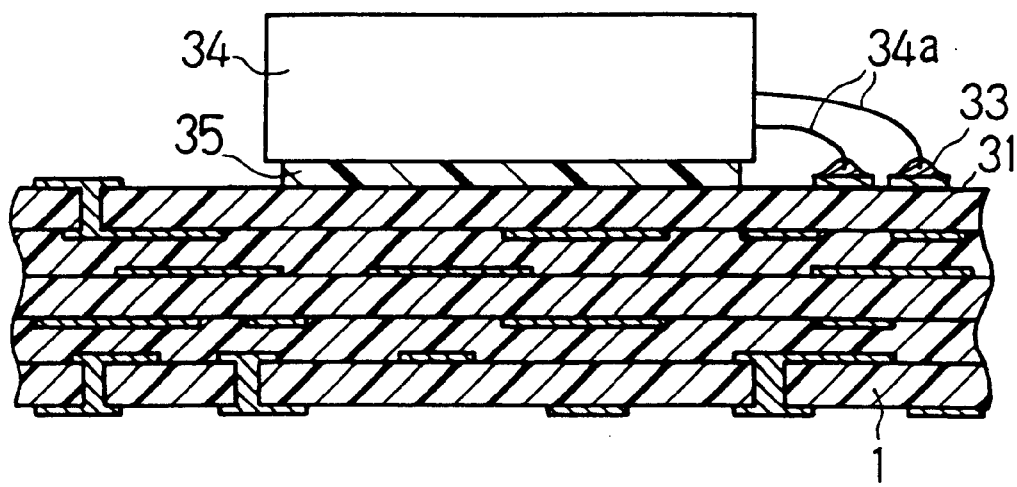
FIG. 17 is a cross-sectional view to show another example of a conventional PWB assembly.

In still another variation shown in FIG. 15, a moving coil (MC) type speaker or microphone is provided by forming a coiled conductive pattern 21a on the nonmagnetic vibration film 21 comprising plastic films, and electrically connecting it to the PWB 1. Alternating electric current flows in the coiled pattern 21a interlinking with the magnetic flux due to the magnet 19. The alternating current vibrates the vibration film 21 on which the coiled pattern 21a is formed. Otherwise, if the vibration film 21 vibrates, the magnetic flux interlinking with the coiled pattern 21a changes and thus, alternating current flows in the coiled pattern 21a. The magnet 19 is adhered to the bottom of the recess 16 of the PWB 1 with an epoxy-type adhesive.

In addition to the above-identified variations, several other variations to construct a speaker or a microphone can be made. By forming a speaker or a microphone integrated with a PWB, the cost for producing an assembly can be significantly decreased compared to the case where a speaker or a microphone as a separate component is mounted on a PWB. In this method, an increasingly light and thin assembly can be provided. The embodiments of this invention can be used for, e.g., electric devices such as portable phones.

As mentioned above, this invention can provide a light and thin assembly by receiving a component in an opening or in a recess formed on a PWB and thus making the component thickness coextensive with the thickness of the PWB. In this embodiment, the area of the PWB can be reduced by mounting another component on the first component and the circuit patterns can be easily designed.

In the method where a recess for receiving component by using a multilayer PWB, the circuit pattern can also be formed by printing, instead of etching. In this invention, the above-mentioned embodiments and their variations can be combined.

The invention may be embodied in other forms without departing from the spirit or essential characteristics thereof. The embodiments disclosed in this application are to be considered in all respects as illustrative and not restrictive. The scope of the invention is indicated by the appended claims rather than by the foregoing description, and all changes which come within the meaning and range of equivalency of the claims are intended to be embraced therein.

What is claimed is:

1. A printed wiring board assembly, comprising an electrical component and a multi-layered printed wiring board, said electrical component being placed in a recess formed in the multi-layered printed wiring board, said multi-layered printed wiring board comprising conductive layers and a plurality of insulating resin-based layers laminated alternately with said conductive layers and having a via hole formed therein, wherein a connecting terminal is provided on a bottom portion of the electrical component which is electrically connected to a conductive pad within said recess by means of a two-stage protruding electrode and a conductive adhesive material, and said conductive pad is electrically connected to said via hole.

2. The printed wiring board assembly according to claim 1, wherein the electrical component received in the recess of said multi-layered printed wiring board is substantially lower than an exterior surface of said multi-layered printed wiring board.

3. A printed wiring board assembly according to claim 1, wherein the recess of said printed wiring board is filled with a sealing resin.

4. A printed wiring board assembly according to claim 1, wherein said printed multi-layered wiring board comprises a insulating layer made of a compressible porous base material impregnated with resin.

* * * * *